US008080280B1

(12) United States Patent
Grubbs et al.

(10) Patent No.: US 8,080,280 B1
(45) Date of Patent: Dec. 20, 2011

(54) NANOSTRUCTURE TEMPLATING USING LOW TEMPERATURE ATOMIC LAYER DEPOSITION

(75) Inventors: Robert K. Grubbs, Albuquerque, NM (US); Gregory R. Bogart, Corrales, NM (US); John A. Rogers, Champaign, IL (US)

(73) Assignee: Sandia Corporation, Albuquerque, NM (US)

( * ) Notice: Subject to any disclaimer, the term of this patent is extended or adjusted under 35 U.S.C. 154(b) by 748 days.

(21) Appl. No.: 11/872,749

(22) Filed: Oct. 16, 2007

(51) Int. Cl.
   *C23C 16/00* (2006.01)
(52) U.S. Cl. .................................. 427/248.1; 427/255.7
(58) Field of Classification Search ............... 427/248.1, 427/255.7
   See application file for complete search history.

(56) References Cited

U.S. PATENT DOCUMENTS

| | | | |
|---|---|---|---|
| 6,090,442 A | 7/2000 | Klaus et al. | |
| 6,342,277 B1 | 1/2002 | Sherman | |
| 6,613,383 B1 | 9/2003 | George et al. | |
| 6,616,986 B2 | 9/2003 | Sherman | |
| 6,652,924 B2 | 11/2003 | Sherman | |
| 6,713,177 B2 | 3/2004 | George et al. | |
| 6,811,814 B2 | 11/2004 | Chen et al. | |
| 6,818,250 B2 | 11/2004 | George et al. | |
| 6,987,071 B1 | 1/2006 | Bollman et al. | |
| 7,045,205 B1 * | 5/2006 | Sager ......................... | 428/304.4 |
| 7,122,827 B2 | 10/2006 | Alizadeh et al. | |
| 7,142,375 B2 | 11/2006 | Nkolov et al. | |
| 7,227,066 B1 | 6/2007 | Roscheisen et al. | |
| 2006/0169160 A1 | 8/2006 | Kornilovich et al. | |
| 2006/0236436 A1 | 10/2006 | Li et al. | |
| 2006/0275926 A1 | 12/2006 | Garcia et al. | |
| 2007/0100086 A1 * | 5/2007 | Hong et al. .................. | 525/416 |
| 2010/0129623 A1 * | 5/2010 | Johansson et al. ............ | 428/206 |

OTHER PUBLICATIONS

Jeon et al., Fabricating three dimensional nanostructures using two photon lithography in a single exposure step, Mar. 20, 2006, Optics Express, vol. 14 No. 6, pp. 2300-2308.*
Jeon, S., et al., "Fabricating complex three-dimensional nanostructures with high-resolution conformable phase masks", Proceedings of the National Academy of Sciences of the United States of America, Aug. 24, 2004, vol. 101, No. 34, pp. 12428-12433.
Jeon, S., et al., "Fabricating three dimensional nanostructures using two photon lithography in a single exposure step", Optics Express, Mar. 2006, vol. 14, No. 6, pp. 2300-2308.
Maria, J., et al., "Experimental and computational studies of phase shift lithography with binary elastomeric masks", J. Vac. Sci. Technol. B 24(2), Mar./Apr. 2006, pp. 828-835.
Rogers, J.A., et al., "Recent progress in soft lithography", Materials Today, Feb. 2005, vol. 8, No. 2, pp. 50-56.
Thompson, E., et al., "Fabrication of Step and Flash Imprint Lithography Templates Using Commercial Mask Processes", Proceedings of the SPIE, 2003, vol. 5037, pp. 1019-1028.
Puurunen, R.L., "Surface chemistry of atomic layer deposition: a case study for the trimethylaluminum/water process", Journal of Applied Physics, Jun. 15, 2005, vol. 97, No. 12.
Picosun, "Sunale R-Series" product brouchure, 4 pages, [online] [retrieved on Sep. 17, 2007] retrieved from the Internet: <URL http://www.picosun.com/files/sunale-r-series.pdf>.

* cited by examiner

*Primary Examiner* — Kelly M Gambetta

(57) ABSTRACT

Methods are described for making nanostructures that are mechanically, chemically and thermally stable at desired elevated temperatures, from nanostructure templates having a stability temperature that is less than the desired elevated temperature. The methods comprise depositing by atomic layer deposition (ALD) structural layers that are stable at the desired elevated temperatures, onto a template employing a graded temperature deposition scheme. At least one structural layer is deposited at an initial temperature that is less than or equal to the stability temperature of the template, and subsequent depositions made at incrementally increased deposition temperatures until the desired elevated temperature stability is achieved. Nanostructure templates include three dimensional (3D) polymeric templates having features on the order of 100 nm fabricated by proximity field nanopatterning (PnP) methods.

21 Claims, 4 Drawing Sheets

NANOSTRUCTURE TEMPLATING USING LOW TEMPERATURE ATOMIC LAYER DEPOSITION

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The invention generally relates to methods for making nanostructures. The invention further relates to methods for making three-dimensional (3D) nanostructures that are stable at elevated temperatures, from templates that are generally not stable at elevated temperatures. The invention additionally relates to methods for making nanostructures comprising a polymeric template of a nanostructure, made robust to elevated temperatures by sequential atomic layer deposition (ALD) of structural coatings at incrementally increasing temperatures. The invention further relates to creating thermally, mechanically and chemically stable nanostructures, from templates comprising photopolymers patterned by proximity field nanopatterning (PnP) methods.

BACKGROUND OF THE INVENTION

Nanostructures (e.g. comprising nanomaterials) are generally defined as structures having at least one physical dimension on the order of 100 nm or less. Nanostructures are of increasing interest due to their unique properties as a result of their extremely small scale, for example electronic properties due to quantum confinement of electrons, optical properties based on transparency and luminescence and material properties due to the increased surface area and edge effects. Nanostructures can comprise nano-particles, quantum dots, carbon nanotubes, nano-wires, fullerenes (i.e. bucky balls), polycrystalline materials with ultrafine grain sizes, and three dimensional (3D) structures either naturally occurring or man made (e.g. synthesized). Examples of naturally occurring nanostructures include spider webs, natural fibers, insect wings etc. Manmade nanostructures can be synthesized directly, for example by gas phase condensation, microstructure refinement through severe plastic deformation induced by ball milling or torsion straining, crystallization from the amorphous state, electrodeposition and sol-gel processing techniques. Examples of some manmade nanostructures include polymers, self-aligned-monolayers (SAMs) and aerogels. Many of these nanostructures comprise materials (e.g. polymers and organic materials) that are not stable at elevated temperatures and/or cannot support mechanical loads and/or are not stable in various chemical environments as often required in applications such as micro-filtering and/or catalysis.

The present inventive methods overcome these limitations by utilizing atomic layer deposition (ALD) to deposit conformal layers of inorganic structural materials onto and within the physical structure of nanostructure templates. The templates themselves can be nanostructures comprising materials (e.g. polymers and organic materials) that are not stable at the elevated temperature of a particular application. By sequentially depositing structural materials layer by layer at incrementally higher temperatures, starting at a temperature equal to or below the maximum temperature at which the template is stable, a robust nanostructure that is stable at an elevated temperature (e.g. higher than the temperature at which the template itself is stable) can be formed from the original template. The resulting nanostructure can comprise a composite of the template within a "shell" of ALD deposited structural layers, or the template can be removed (e.g. dissolved, desorbed, decomposed etc.) to create a nanostructure formed of the deposited structural layers. The self-limiting surface chemistry of the ALD process provides atomic control of film thickness and additionally provides the ability to conformally coat shadowed, non line-of-sight, high aspect ratio features within nanoscale three-dimensional structures, that can be impractical by other deposition methods.

BRIEF DESCRIPTION OF THE DRAWINGS

The accompanying drawings, which are incorporated in and form part of the specification, illustrate several embodiments of the present invention and, together with the description, serve to explain the principles of the invention. The drawings provided herein are not drawn to scale.

DETAILED DESCRIPTION OF THE INVENTION

A nanostructure template (i.e. a template of a nanostructure) as used herein refers to a structure that contains features of at least one physical dimension on the order of 100 nm, and is typically formed of a material that is not stable up to a desired use or service temperature. While a nanostructure template is of itself a nanostructure in all respects, as used herein a nanostructure template serves as a base (i.e. template) for replicating the nanostructure defined by the template, by the sequential atomic layer deposition of structural layers, whereby the deposited structural layers provide thermal, mechanical and chemical stability to the (i.e. replicated) nanostructure, to conditions under which the template itself would otherwise be degraded.

Figure 1:
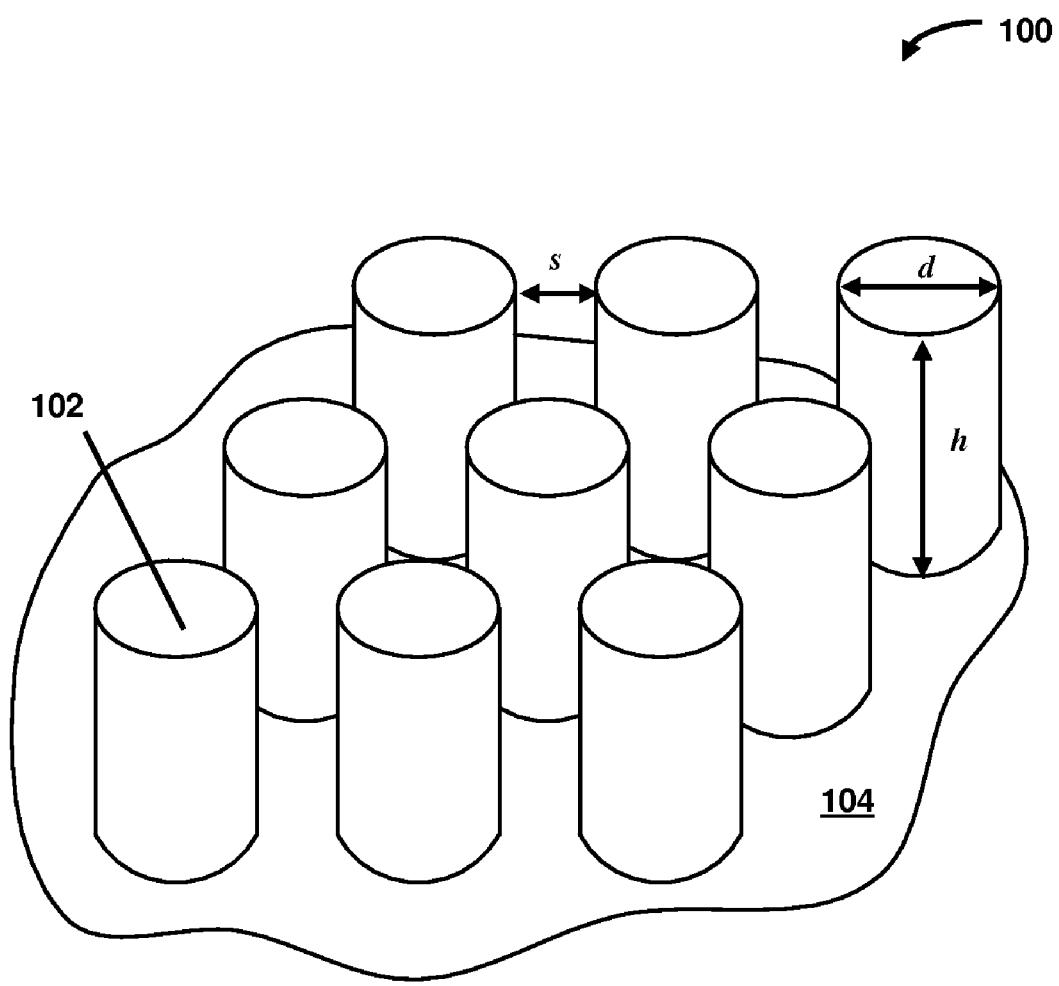
FIG. 1 is a schematic illustration of an exemplary embodiment of a nanostructure template.

FIG. 1 is a schematic illustration of an exemplary embodiment of a simple nanostructure template. Nanostructure template 100 can for example comprise polymeric materials, self-aligned monolayers (SAMs), aerogels and naturally occurring products such as spider webs, natural fibers, insect wings etc. The exemplary nanostructure template 100 is, for simplicity, illustrated as a three dimensional structure comprising a series of columns or posts 102 having a diameter "d", height "h", and inter-post spacing "s", distributed over the surface of a substrate 104, wherein at least one of the physical parameters of the nanostructure "d", "h", and "s" is less than a value on the order of 100 nm, the remaining parameters having values either less than or greater than on the order of 100 nm. It is not necessary that all features, i.e. posts 102, be of like dimension or shape. Template 100 can as well comprise posts, columns or other features interconnected at various levels (e.g. as a framework) and anticipates structures that are self-supporting, i.e. either formed without the use of a substrate or those structures that are formed on and then released from a supporting substrate. Nanostructure template 100 can comprise for example, a photopolymer, patterned by photolithographic techniques, as described below.

Figure 2:
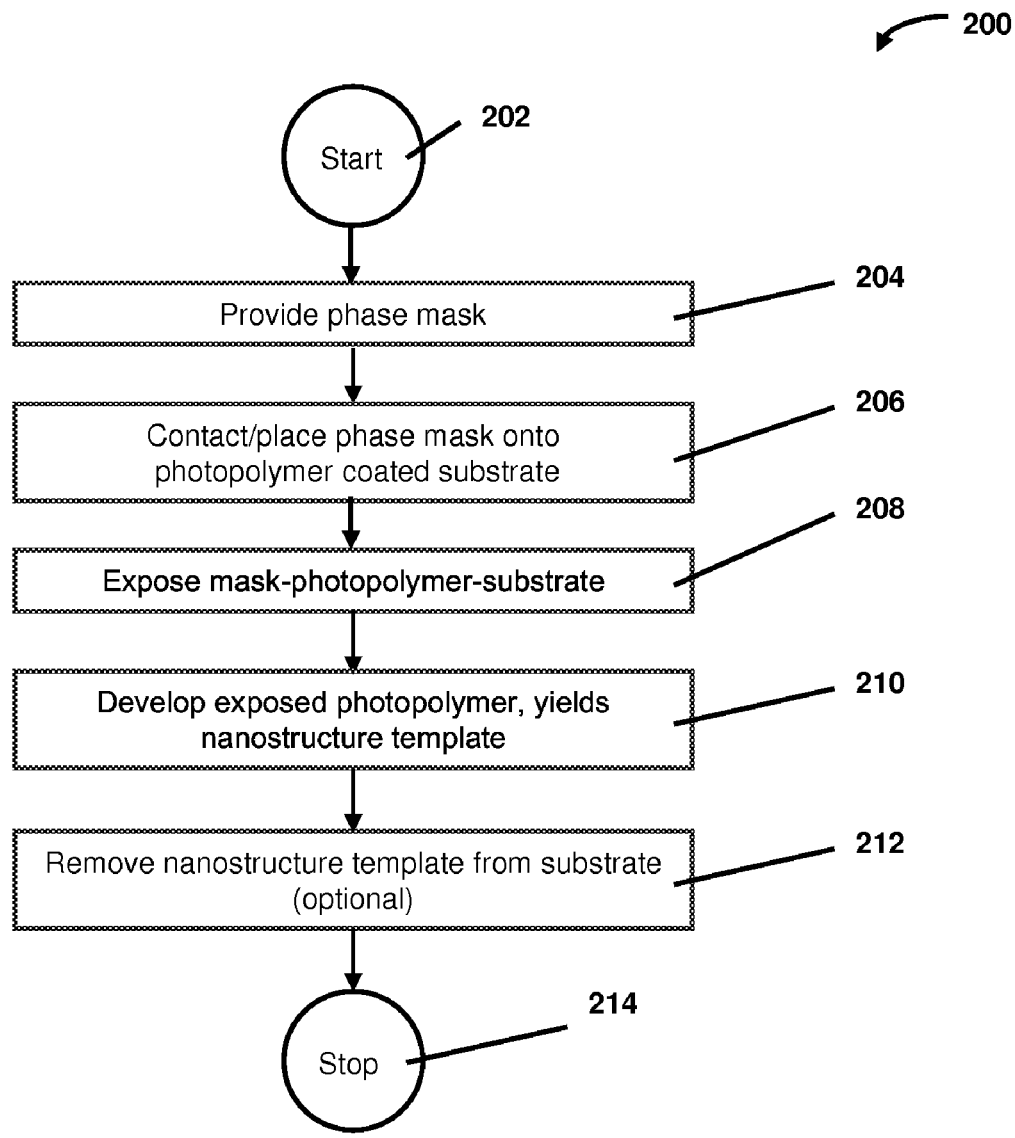
FIG. 2 is a schematic flow chart of an embodiment of a proximity field nanopatterning method (PnP) for producing nanostructure templates from photopolymers.

FIG. 2 is a schematic flow chart of an embodiment of a proximity field nanopatterning method (PnP) for producing nanostructure templates from photopolymers. Detailed descriptions of the PnP method and examples of various three-dimensional (3D) nanostructures that can be produced are provided in detail elsewhere, see for example; Jeon, S., et al., "Fabricating complex three-dimensional nanostructures with high-resolution conformable phase masks", Proceedings of the National Academy of Sciences of the United States of America, Aug. 24, 2004, vol. 101, no. 34, pp. 12428-12433 and Rogers, J. A., et al., "Experimental and computational studies of phase shift lithography with binary elastomeric masks", J. Vac. Sci. Technol. B24(2), March/April 2006, pp. 828-835, the entirety of each of which is incorporated herein by reference.

In the PnP process high-resolution, conformable phase masks provide a means to fabricate classes of 3D nanostructures that are technologically important but difficult to produce by other means. In this approach, exposure lighting comprising a wavelength is passed through a phase mask, which has features of relief comparable in dimension to the exposure wavelength, and onto a photopolymer coated substrate. The exposure through the phase mask causes a 3D distribution of intensity (e.g. by constructive and destructive interference of the wavelength) throughout the thickness of the photopolymer. Developing the photopolymer yields a structure in the geometry of the intensity distribution with nanoscale feature sizes (e.g. approximately 50 nm up to approximately 1000 nm) that are less than the wavelength of the light used to expose the photopolymer. The PnP process therefore allows one to create complex and useful 3D nanostructure templates.

The PnP process starts at step 202. At step 204 a suitable phase mask is provided for generation of the desired nanostructure template. In the PnP process a phase mask can be produced by conventional lithographic means with features having dimensions that can be on the order of 400 nm. Phase masks can for example, be produced by patterning features into a photoresist layer on a silicon wafer and replicating the patterned features with layers of a castable material such as polydimethylsiloxane (PDMS). PDMS phase masks can be useful where it is desired to have a flexible phase mask, for example, a phase mask that can conform to surface features that may exist on a substrate. The silicon wafers with the patterned photoresist layers serve as "masters" for the production of the PDMS phase masks. After the PDMS layer is cured, it is removed from the master and used in subsequent processing.

At step 206, the phase mask is contacted onto a substrate coated with a photopolymer (i.e. the photopolymer will form the eventual nanostructure template). The photopolymer can comprise for example, a 5 to 100 micron thick layer of SU-8, commercially available from MicroChem Corp., Newton, Mass., USA. Because the exposure of the polymer occurs in the proximity field region of the mask, the process is referred to as proximity field nanopatterning (PnP). While it is not necessary for the phase mask to be conformable, the conformable nature of PDMS facilitates intimate contact of the phase mask with the photopolymer during exposure.

At step 208 the photopolymer is illuminated through the phase mask, e.g. by a flood exposure using ultra-violet light, generating an intensity distribution that exposes the photopolymer throughout its thickness. The nature of the intensity distribution (and therefore resulting nanostructure) as a function of phase mask geometry is discussed in the references cited above.

At step 210 the exposed photopolymer is developed by washing away the parts of the polymer that are not crosslinked by the UV light yielding a 3D nanostructure in the geometry of the intensity distribution with feature sizes as small as approximately 50 nm.

At optional step 212 the nanostructure template comprising the developed photopolymer can be used as is or subsequently processed (e.g. dried, baked etc.) and/or removed from the supporting substrate. The method ends at step 214.

The proximity geometry places requirements on the spatial and temporal coherence of the light source that can easily be met with a low-cost setup (e.g. a handheld lamp with a spectral filter to define the exposure wavelength is sufficient). Only the spot size of the light source and the size of the phase mask limit the size of the patterned areas. Nanostructures with thicknesses on the order of 100 microns have been achieved. Only the structural integrity and optical absorption of the photopolymer limit the thickness of the nanostructure template formed. The nanostructure templates thus produced can serve as a framework or sub-structure for the subsequent deposition of structural layers by atomic layer deposition (ALD).

Atomic layer deposition (ALD) is a chemical vapor deposition (CVD) process capable of depositing structural layers including inorganic materials, at thicknesses on the order of monolayers or greater. ALD comprises a film deposition process based on the sequential use of self-terminating gas-solid half-reactions that can occur at sub-atmospheric pressures. As such ALD can conformably deposit materials into complex three-dimensional structures (i.e. templates) having shadowed, non line-of-sight, high aspect ratio features, the features having dimensions on the order of 100 nm or less. Detailed descriptions of ALD processes, appropriate chemistries and exemplary applications can be found elsewhere, see for example; Puurunen, R. L., "Surface chemistry of atomic layer deposition: a case study for the trimethylaluminum/water process", Journal of Applied Physics, Jun. 15, 2005, vol. 97, no. 12 and, U.S. Pat. No. 6,818,250 issued Nov. 16, 2004 to George et al., the entirety of each of which is incorporated herein by reference.

Figure 3:
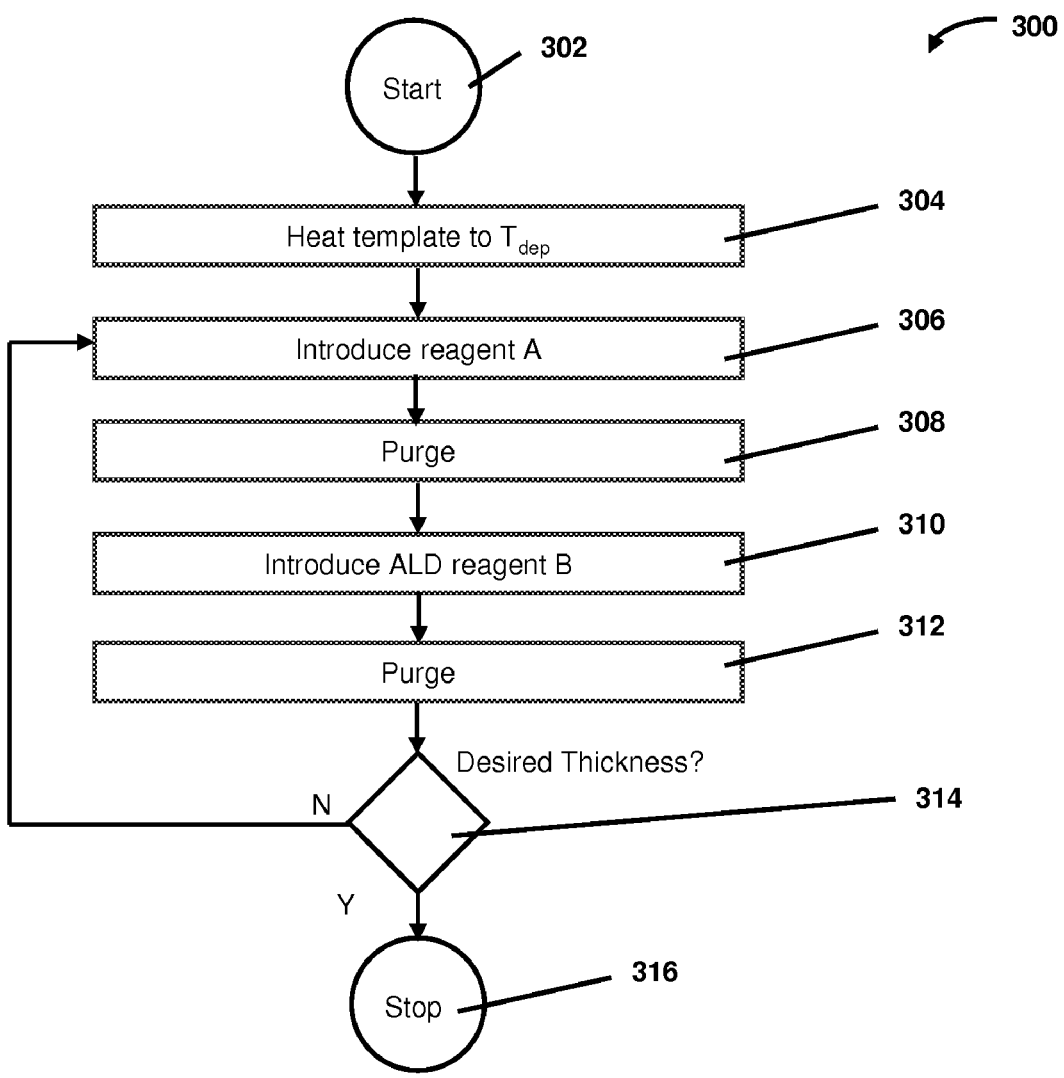
FIG. 3 is a schematic flow chart of an embodiment of an atomic layer deposition process.

FIG. 3 is a schematic flow chart of an embodiment of an atomic layer deposition process. The atomic layer deposition process 300 starts at step 302. At step 304 a nanostructure template (e.g. a substrate) is placed into the reaction chamber of an ALD system (e.g. vacuum chamber) evacuated and heated to a deposition temperature. Suitable ALD reactors can be obtained commercially, for example, the Sunale™ R-Series of reactors offered by Picosun USA LLC, Detroit, Mich., USA.

At step 306 a carrier gas (e.g. nitrogen) is used to transfer a first reactant, for example, trimethylaluminum as in the case of alumina oxide deposition, to uniformly cover the exposed external and internal surfaces of the template. Typical deposition pressures can range from on the order of 10 mTorr to on the order of 10 Torr.

At step 308 excess quantities of the first reactant are purged from the chamber by flowing carrier gas.

At step 310 the carrier gas is used to introduce a second reactant for example water, as in continuing the example of alumina oxide deposition, to uniformly cover and react with the layer of the first reactant (e.g. trimethylaluminum) to form the desired layer (e.g. aluminum oxide). Unconsumed reactants are then purged from the reaction chamber at step 312, by flowing carrier gas. Steps 306 through 312 comprise one deposition cycle. Steps 306 and 310 each comprise a "half-reaction".

At step 314 if the desired thickness of the deposited layer has been achieved, the process ends at step 316. If a greater thickness is desired for the deposited layer, the process returns to step 306 and is repeated until the desired thickness is achieved.

For the case of nanostructure templates, the conformal nature of the ALD process results in the deposition of structural layers onto both the external and internal surfaces of the nanostructure, thereby substantially encasing the nanostructure template within a structurally supporting "shell" comprising the deposited layers of structurally "robust" materials. Many synthetic methods can create nanostructures with limited temperature stability. Embodiments of methods according to the present invention can stabilize or "lock-in" a nanostructure (e.g. comprising a template) so that it is stable at an elevated use or service temperatures. Methods according to the present invention essentially convert non-robust nanostructure templates to thermally, mechanically and chemically robust nanostructures. Using a graded temperature deposition approach, nanostructures can be created with reduced intrinsic stress which allows large area or volume nanostructures to be created that are thermally stable at elevated temperature.

Figure 4:
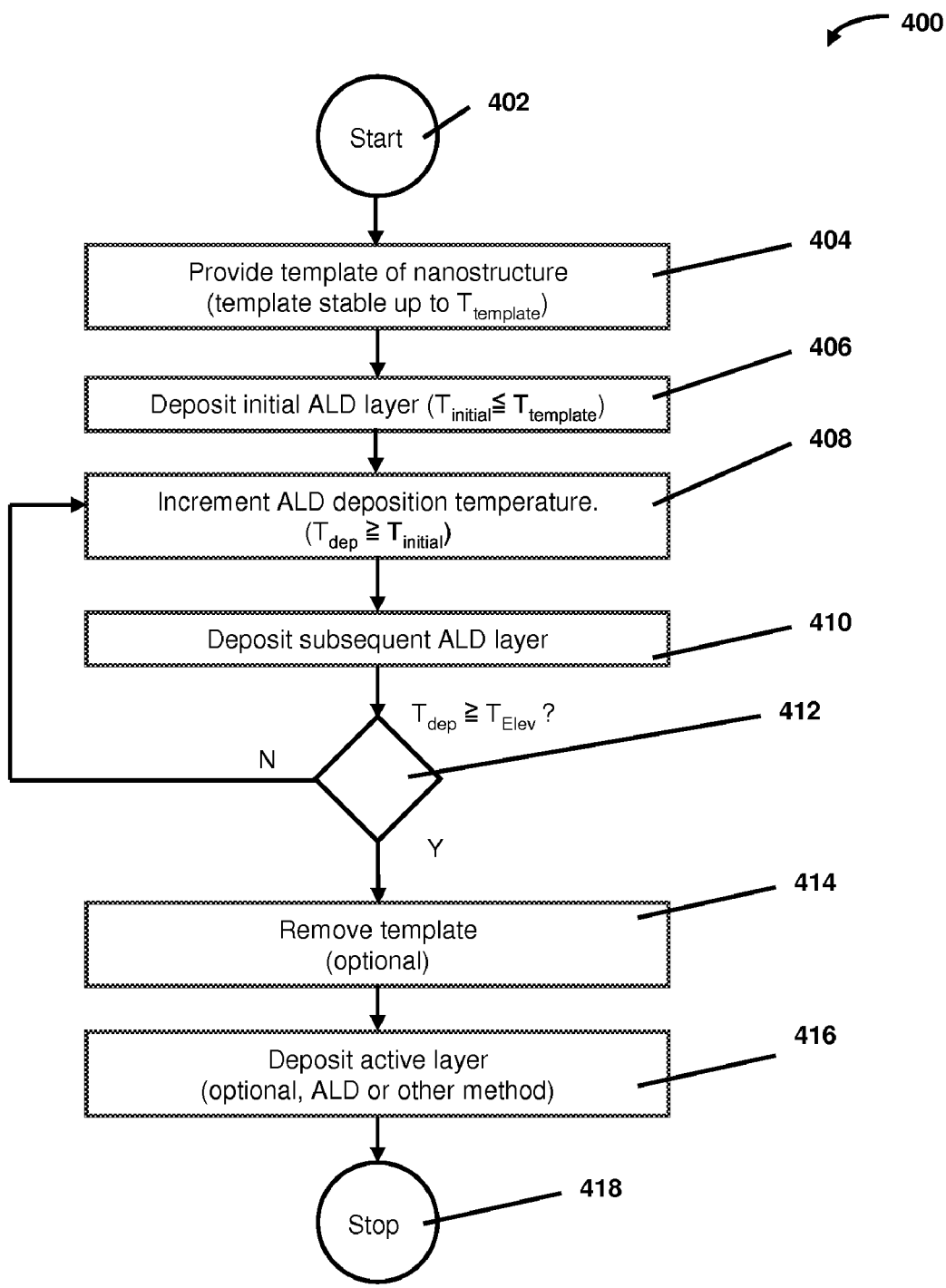
FIG. 4 is a schematic flow chart of an embodiment of a method for producing a nanostructure from a template of the nanostructure, according to the present invention.

FIG. 4 is a schematic flow chart of an embodiment of a method for producing a nanostructure from a template of the nanostructure, according to the present invention. The method 400 begins at step 402.

At step 404 a template of a nanostructure is placed into a reaction chamber operationally configured for the deposition of structural layers by atomic layer deposition (ALD). The template of the nanostructure can comprise naturally occurring nanostructures such as found in spider webs, natural fibers, and insect wings, and/or manmade nanostructures comprising polymers, self-assembled-monolayers (SAMs), aerogels, carbon nanotubes and photopolymer nanostructures defined by proximity field nanopatterning (PnP). In the context of the present invention, the template of the nanostructure can comprise an organic material that is mechanically, thermally and/or chemically stable up to a maximum temperature of ($T_{template}$) where ($T_{template}$) is less than a desired elevated operating or application temperature ($T_{elev}$). $T_{template}$ is a function of the material comprising the template and as well depends on the conditions of the deposition cycle (e.g. vacuum and mechanical loading of the template). $T_{template}$ is defined to be that temperature whereat a nanostructure template indicates softening, sagging, chemical break-down, dis-assembly, decomposition, desorption or destruction.

At step 406 an initial structural layer is deposited by ALD at a deposition temperature ($T_{initial}$) which is less than or equal to the stability temperature of the template ($T_{template}$). The deposition of the initial structural layer as well as any subsequent structural layers deposited by ALD can comprise one or more deposition cycles as described above and illustrated in FIG. 3. I.e. each deposition step in FIG. 4 can comprise repeated cycles of exposure to reagents with inter-posing purge cycles.

At step 408, after the deposition of the initial structural layer, the deposition temperature is incrementally increased ($T_{dep} \geq T_{initial}$) and a subsequent structural layer is deposited onto the template at step 410. This process is repeated (e.g. incrementally increasing the deposition temperature for subsequent layers) until a deposition temperature is obtained that is substantially equal to or greater than the desired operating temperature (e.g. $T_{dep} \geq T_{elev}$).

At step 412 if the deposition temperature is less than the desired operating temperature, the deposition temperature is incrementally increased and the process returns to step 408.

At optional step 414, the nanostructure template can be removed from the now formed composite comprising the template and structural layers deposited by atomic layer deposition. For example, a template comprising an organic material could be removed from a composite comprising inorganic structural layers, by methods such as plasma-ashing (e.g. oxygen plasma), ultra-violet light and ozone (e.g. UV-ozone), heating, vacuum baking, solvent dissolution, acid dissolution, alkali dissolution and thermal desorption. In applications utilizing embodiments of the methods of the present invention, step 414 has been found to be completely optional.

At optional step 416 an "active" layer can be deposited on the now structurally robust, coated template. Active layers can comprise for example, platinum metal which can function as catalyst layers or reflective layers for photonic band-gap applications, and chemical getters such as zinc oxide. Active layers can be deposited by atomic layer deposition or other deposition methods including sputtering, vacuum evaporation, electrochemical depositions etc.

The method ends at step 418.

In a first exemplary application of the inventive methods, it was desired to create a high surface area nanostructure for utilization as a sulfur getter. Zinc oxide was the active layer (i.e. gettering layer) in this application.

A three dimensional (3D) nanostructure template comprising a cubic lattice was formed by the PnP process in a photolyzed SU-8 photopolymer with feature sizes of 400 nm. It was desired that the eventual robust nanostructure would accommodate an elevated operating temperature ($T_{elev}$) of approximately 500° C. The template was empirically determined to be stable at temperatures up to approximately 90° C. ($T_{template}$). The ALD reactor was set to a temperature of 85° C. ($T_{initial}$) and a reactor pressure of 1.0 Torr. The carrier gas was N2 and flowed at a rate of 200 sccm through the reactor. The initial depositions were of alumina using one second pulses of trimethylaluminum and water. Between each of these pulses there was a 10 second purge cycle. The nanostructure template was placed in the ALD reactor where graded temperature ALD processing occurred (e.g. according to FIG. 4) without an air break in the reactor. The zinc oxide chemistry used was diethylzinc and water. These were pulsed at 20 seconds with a subsequent purge of 3 seconds. It was assumed that the growth rate for ALD alumina was 0.10 nm/deposition cycle and 0.15 nm/deposition cycle for zinc oxide. The temperature and deposition schedule for this example is given below in Table 1.

TABLE 1

Deposition Schedule for The First Exemplary Application

Nanostructure template comprising SU-8 photopolymer (PnP).
Deposit 9 nm of ALD alumina at an initial temperature of 85° C. (below the maximum stability temperature of template).
Deposit 5 nm of ALD alumina at a temperature of 130° C.
Deposit 3 nm of ALD alumina at a temperature of 200° C.
Deposit 4 nm of ALD zinc oxide at a temperature of 250° C.
Deposit 2 nm of ALD zinc oxide at a temperature of 300° C.

The result is a nanostructure conformally coated with zinc oxide for use as a sulfur getter for hydrogen feed stock at high temperatures (approximately 500° C.) in a fuel cell application.

In a second exemplary application of the inventive methods, it was desired to create a photonic bandgap structure utilizing platinum metal.

A three dimensional (3D) nanostructure template comprising a cubic lattice was formed by the PnP process in a photolyzed SU-8 photopolymer with feature sizes of 400 nm. It was desired that the eventual robust nanostructure would accommodate an elevated operating temperature ($T_{elev}$) of approximately 300° C. The template was empirically determined to be stable at temperatures up to approximately 90° C., ($T_{template}$). The reactor was operated under conditions similar to those for the example described above, using titanium oxide (i.e. titania) as structural layers and platinum metal as the active layer. The temperature and deposition schedule for this example is given below in Table 2.

TABLE 2

Deposition Schedule for The Second Exemplary Application

Nanostructure template comprising SU-8 photopolymer (PnP).
Deposit 9 nm of ALD titania at an initial temperature of 85° C. (below the maximum stability temperature of template).
Deposit 5 nm of ALD titania at a temperature of 130° C.
Deposit 3 nm of ALD titania at a temperature of 200° C.
Deposit 2 nm of ALD titania at a temperature of 275° C.
Deposit 3 nm of ALD platinum at a temperature of 300° C.

The result is a nanostructure conformally coated with platinum for use as a photonic nanostructure compatible with the high deposition temperature (approximately 300° C.) associated with the platinum deposition.

The above described exemplary embodiments present several variants of the invention but do not limit the scope of the invention. Those skilled in the art will appreciate that the present invention can be implemented in other equivalent ways. The actual scope of the invention is intended to be defined in the following claims.

What is claimed is:

1. A method of making a nanostructure that is stable at an elevated temperature from a template of the nanostructure, the method comprising:
providing the template of the nanostructure, the template of the nanostructure having a stability temperature ($T_{template}$) that is less than the elevated temperature;
depositing by atomic layer deposition (ALD) at least one structural layer of a material onto the template at an initial deposition temperature ($T_{initial}$) wherein the initial deposition temperature is equal to or less than the stability temperature of the template ($T_{initial} \leq T_{template}$); and,
depositing by atomic layer deposition (ALD) at least one additional structural layer of the material onto the template, wherein the at least one additional structural layer of the material is deposited at least one additional deposition temperature ($T_{dep}$) wherein the at least one additional deposition temperature is greater than the initial deposition temperature ($T_{dep} > T_{initial}$).

2. The method of claim 1 further comprising the step of depositing an active layer onto the template, after said step of depositing by atomic layer deposition (ALD) the at least one additional structural layer of the material onto the template.

3. The method of claim 2 wherein said step of depositing an active layer onto the template comprises depositing an active layer by atomic layer deposition (ALD) onto the template.

4. The method of claim 3 wherein the active layer comprises one or more layers selected from the group consisting of a platinum layer and a zinc oxide layer.

5. The method of claim 1 further comprising the step of removing the template from a composite structure comprising the template and one or more structural layers, said removing comprising one or more actions selected from the group consisting of heating, vacuum baking, solvent dissolution, acid dissolution, alkali dissolution, plasma processing, ultra-violet (UV) ozone processing and thermal desorption.

6. The method of claim 1 wherein said step of providing the template comprises providing a proximity field nanopatterned (PnP) template.

7. The method of claim 6 wherein the proximity field nanopatterned (PnP) template comprises a photopolymer.

8. The method of claim 1 wherein at least one structural layer comprises one or more structural layers selected from the group consisting of an alumina layer and a titania layer.

9. The method of claim 1 wherein the initial deposition temperature ($T_{initial}$) and the at least one additional deposition temperature ($T_{dep}$) are selected from the range of temperatures from approximately 85° C. up to approximately 300° C.

10. A method of making a nanostructure that is stable at an elevated temperature from a template of the nanostructure, the method comprising:
providing the template of the nanostructure, the template of the nanostructure having a stability temperature;
depositing by atomic layer deposition (ALD) at least one structural layer of alumina at an initial deposition temperature, wherein the initial deposition temperature is equal to or less than the stability temperature of the template;
depositing by atomic layer deposition (ALD) at least one additional structural layer of alumina at least one deposition temperature greater than the stability temperature of the template; and,
depositing by atomic layer deposition (ALD) at least one active layer of zinc oxide at least one deposition temperature greater than the stability temperature of the template.

11. The method of claim 10 wherein the step of providing the template comprises providing a proximity field nanopatterned (PnP) template.

12. The method of claim 11 wherein the proximity field nanopatterned (PnP) template comprises a photopolymer.

13. The method of claim 10 wherein the thickness of each structural layer of alumina deposited by atomic layer deposition is selected from the range of thickness from approximately 3 nm up to approximately 9 nm.

14. The method of claim 10 wherein the thickness of each active layer of zinc oxide deposited by atomic layer deposition is selected from the range of thickness from approximately 2 nm thick up to approximately 4 nm thick.

15. The method of claim 10 wherein the initial deposition temperature is approximately 85° C.

16. A method of making a nanostructure that is stable at an elevated temperature from a template of the nanostructure, the method comprising:
providing the template of the nanostructure, the template of the nanostructure having a stability temperature;
depositing by atomic layer deposition (ALO) at least one structural layer of titania at an initial deposition temperature, wherein the initial deposition temperature is equal to or less than the stability temperature of the template;
depositing by atomic layer deposition (ALD) at least one additional structural layer of titania at least one deposition temperature greater than the stability temperature of the template; and, depositing by atomic layer deposition (ALD) at least one active layer of platinum at least one deposition temperature greater than the stability temperature of the template.

17. The method of claim 16 wherein said step of providing the template comprises providing a proximity field nanopatterned (PnP) template.

18. The method of claim 17 wherein the proximity field nanopatterned (PnP) template comprises a photopolymer.

19. The method of claim 16 wherein the thickness of each structural layer of titania deposited by atomic layer deposition is selected from the range of thickness from approximately 2 nm up to approximately 7 nm.

20. The method of claim 16 wherein the thickness of each active layer of platinum deposited by atomic layer deposition is selected from the range of thickness from approximately 2 nm thick up to approximately 4 nm thick.

21. The method of claim 16 wherein the initial deposition temperature is approximately 85° C.

* * * * *